United States Patent
Gan et al.

(10) Patent No.: US 8,823,354 B2
(45) Date of Patent: Sep. 2, 2014

(54) POWER SEMICONDUCTOR SWITCH SERIES CIRCUIT AND CONTROL METHOD THEREOF

(75) Inventors: Hong-Jian Gan, Shanghai (CN); Jian-Ping Ying, Shanghai (CN); Jie Fu, Shanghai (CN); Wei-Liang Fu, Shanghai (CN); Ming Wang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 206 days.

(21) Appl. No.: 13/571,874

(22) Filed: Aug. 10, 2012

(65) Prior Publication Data

US 2013/0083576 A1 Apr. 4, 2013

(30) Foreign Application Priority Data

Sep. 29, 2011 (CN) .......................... 2011 1 0294551
Jul. 3, 2012 (CN) .......................... 2012 1 0228865

(51) Int. Cl.
*G05F 1/00* (2006.01)
*H03K 17/60* (2006.01)
*H02H 7/122* (2006.01)
*H03K 17/082* (2006.01)
*H03K 17/10* (2006.01)
*H02M 1/088* (2006.01)
*H03K 17/16* (2006.01)

(52) U.S. Cl.
CPC .......... *H03K 17/0828* (2013.01); *H03K 17/107* (2013.01); *H03K 17/166* (2013.01); *H02M 1/088* (2013.01); *H03K 17/168* (2013.01)
USPC .......................... 323/289; 327/482; 363/56.04

(58) Field of Classification Search
USPC .......... 323/238, 271, 289; 327/406–405, 423, 327/424, 482; 363/40, 56.03–56.05, 363/56.09–56.12
See application file for complete search history.

(56) References Cited

U.S. PATENT DOCUMENTS

| | | | | |
|---|---|---|---|---|
| 3,987,357 | A * | 10/1976 | Edstrom et al. | 323/271 |
| 2003/0058663 | A1 * | 3/2003 | Bennett | 363/40 |
| 2010/0277143 | A1 * | 11/2010 | Kudo et al. | 323/271 |

* cited by examiner

*Primary Examiner* — Adolf Berhane
*Assistant Examiner* — Gary Nash
(74) *Attorney, Agent, or Firm* — CKC & Partners Co., Ltd.

(57) ABSTRACT

The present disclosure provides a power semiconductor switch series circuit. The power semiconductor switch series circuit includes a plurality of series modules and a system control module. Each series module has a power semiconductor switch; a drive module for driving each power semiconductor switch to be turned on or turned off; a short-circuit detection unit for outputting at least one detection signal; an equalizer circuit; a comparison module for comparing the detection signal with a predetermined threshold, and outputting a short-circuit signal when the detection signal exceeds the predetermined threshold; and a soft turn-off module for receiving the short-circuit signal and outputting a second control signal. The system control module receives the short-circuit signal and outputs a first control signal.

17 Claims, 6 Drawing Sheets

POWER SEMICONDUCTOR SWITCH SERIES CIRCUIT AND CONTROL METHOD THEREOF

RELATED APPLICATIONS

This application claims priorities to Chinese Application Serial Number 201110294551.X, filed Sep. 29, 2011, and Chinese Application Serial Number 201210228865.4, filed Jul. 3, 2012, which are herein incorporated by references in its entirety.

BACKGROUND

1. Field of Invention

The present disclosure relates to a power semiconductor switch series connection technique. More particularly, the present disclosure relates to a design of a power semiconductor switch series circuit and a control method thereof.

2. Description of Related Art

Modern high voltage and high power converters require a power device having a high withstand voltage value. However, a single power device cannot meet this requirement. In one solution of the prior art, a plurality of power semiconductor switch devices are directly connected in series. For example, the power semiconductor switch device may be a thyristor, a GTO (Gate Turn-off Thyristor) or an IGBT (Insulated Gate Bipolar Transistor), which may be applied in electronic equipment such as a high-voltage DC (direct current) circuit, a SVC (Static Var Compensator) or a high-voltage inverter.

However, when a conventional device such as the thyristor or the GTO is employed for series connection, the power consumption is large and the switching speed is slow, and as a result, such a conventional device cannot be widely applied in a PWM converter. In comparison, the IGBT, which is a semiconductor power device introduced in the 1980's, has a voltage control input characteristic and a low-impedance on-state output characteristic, and the switching speed of the IGBT is fast. Consequently, the IGBT can fully satisfy the requirement of the PWM converter technique. On the other hand, although the IGBT index and the gate control signal circuit in the series circuit are totally the same, due to the fact that each IGBT has a different performance and switching speed, the component parameters of the gate control signal circuit are not consistent and the circuit has distributed inductance and distributed capacitance, the switching actions of the IGBTs are not consistent, thus causing a negative consequence that a voltage between a collector and an emitter exceeds a rated withstand voltage value when an individual IGBT device is turned on or turned off thereby damaging the power device. Furthermore, in the power switch series circuit, if due to some faults, the overcurrent happens to the IGBT device when the IGBT device is turned ON, once the overcurrent is not detected effectively, the IGBT device may be failed due to the overcurrent.

In view of the above, many in the industry are endeavoring to find ways in which to improve the power semiconductor switch series circuit of the prior art, so as to quickly protect the power semiconductor switch when an abnormal situation is encountered with the circuit, thereby improving the operation reliability of the series circuit.

SUMMARY

The present disclosure provides a novel power semiconductor switch series circuit and a control method thereof.

A technical aspect of the present disclosure relates to a power semiconductor switch series circuit. The power semiconductor switch series circuit includes a plurality of series modules and a system control module. Each series module has a power semiconductor switch, a drive module, a short-circuit detection unit, an equalizer circuit, a comparison module, and a soft turn-off module. The power semiconductor switch has a first terminal for receiving a drive signal to drive the power semiconductor switch to be turned on or turned off; a second terminal coupled to a third terminal of a power semiconductor switch of an adjacent series module; and a third terminal coupled to a second terminal of power semiconductor switch of another adjacent series module. The drive module is connected electrically to the first terminal of the power semiconductor switch, for outputting the drive signal, and the power semiconductor switch is turned on or turned off through the drive signal. The short-circuit detection unit is connected electrically to the power semiconductor switch, for outputting at least one detection signal. The equalizer circuit is connected electrically between the second terminal and the third terminal of the power semiconductor switch, for performing static and dynamic voltage equalization on the power semiconductor switch. The comparison module is connected electrically to the short-circuit detection unit, for receiving the detection signal, comparing the detection signal with a predetermined threshold and outputting a short-circuit signal when the detection signal exceeds the predetermined threshold. The soft turn-off module receives the short-circuit signal from the comparison module and outputs a second control signal corresponding to the short-circuit signal to the drive module. The system control module is connected electrically to the comparison module and the drive module of each series module, and when receiving the short-circuit signal from the comparison module, the system control module outputs a first control signal corresponding to the short-circuit signal to the drive module of each series module, so as to turn off the power semiconductor switch of each series module.

Another technical aspect of the present disclosure relates to a control method of the power semiconductor switch series circuit as mentioned above is provided. The control method includes: reading the detection signal outputted by the short-circuit detection unit; comparing the detection signal and the predetermined threshold; outputting a short-circuit signal when the detection signal exceeds the predetermined threshold; outputting a first control signal corresponding to the short-circuit signal according to the short-circuit signal and sending the first control signal to the drive module of each series module, so as to drive the power semiconductor switch of each series module to be turned off; and outputting a second control signal corresponding to the short-circuit signal according to the short-circuit signal and sending the second control signal to the drive module of the corresponding series module, so as to drive the power semiconductor switch of the series module to be turned off, in which the second control signal reaches the drive module in advance of the first control signal.

Yet another technical aspect of the present disclosure relates to a power conversion apparatus comprising a three-phase converter is provided. A bridge arm of each phase of the three-phase converter has at least two sub-bridge arms. Each of the sub-bridge arms is formed by at least one or more power semiconductor switch series circuits as mentioned above.

BRIEF DESCRIPTION OF THE DRAWINGS

Various aspects of the disclosure can be more clearly understood after reading the following specific embodiments of the embodiment, with reference to the accompanying drawings. In the drawings.

DETAILED DESCRIPTION

Figure 1:
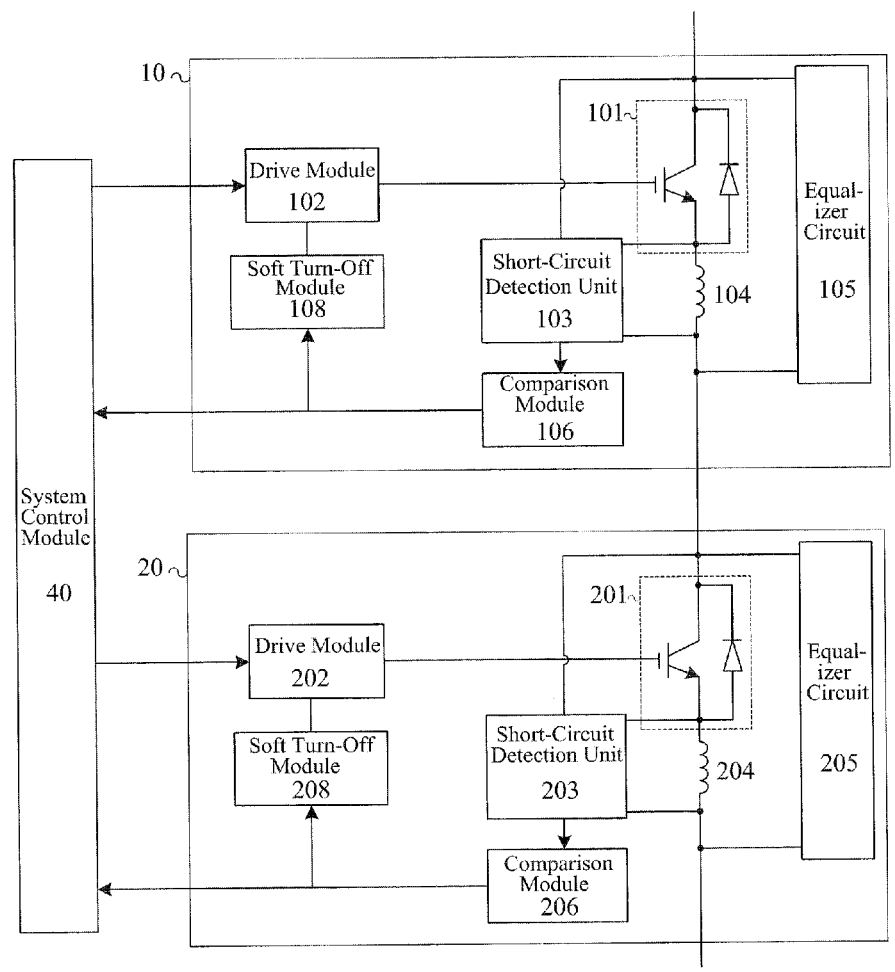
FIG. 1 is a schematic block diagram of a power semiconductor switch series circuit according to an aspect of the present disclosure.

Specific embodiments of the present disclosure are further described in detail below with reference to the accompanying drawings.

In order to make the description of the present disclosure more detailed and more comprehensive, various embodiments are described below with reference to the accompanying drawings. The same reference numbers are used in the drawings to refer to the same or like elements. However, the embodiments are not intended to limit the present disclosure. Moreover, it is not intended for the description of operation to limit the order of implementation. Any device with equivalent functions that is produced from a structure formed by a recombination of elements shall fall within the scope of the present disclosure.

The drawings are only illustrative and are not made according to actual size. Additionally, well-known elements and steps are not described in the embodiments to avoid causing unnecessary limitations to the present disclosure.

FIG. 1 is a schematic block diagram of a power semiconductor switch series circuit according to an aspect of the present disclosure. Referring to FIG. 1, the power semiconductor switch series circuit includes series modules 10 and 20 and a system control module 40. Specifically, the series module 10 includes a power semiconductor switch 101, a short-circuit detection unit 103, an equalizer circuit 105, a comparison module 106, a soft turn-off module 108 and a drive module 102. The series module 20 includes a power semiconductor switch 201, a short-circuit detection unit 203, an equalizer circuit 205, a comparison module 206, a soft turn-off module 208 and a drive module 202.

Taking the series module 10 as an example for description, the first terminal of the power semiconductor switch 101 is connected to the drive module, so as to drive the power semiconductor switch to be turned on or turned off according to the drive signal outputted by the drive module 102; the second terminal of the power semiconductor switch 101 is coupled to a third terminal of the power semiconductor switch of an adjacent series module; and the third terminal of the power semiconductor switch 101 is coupled to a second terminal of the power semiconductor switch of another adjacent series module; for example, the third terminal of the power semiconductor switch 101 of the series module 10 is coupled to the second terminal of the power semiconductor switch 201 of the series module 20.

The short-circuit detection unit 103 is connected electrically to the power semiconductor switch 101, so as to output at least one detection signal by detecting the short-circuit parameters of the power semiconductor switch series circuit.

In an embodiment, the series module 10 includes an inductance element 104 connected in series between the power semiconductor switches 101 and 201 of the series modules 10 and 20. The short-circuit detection unit 103 is connected electrically between two terminals of the inductance element 104, so as to output a detection signal to the comparison module 106 by detecting the di/dt value of the current flowing through the inductance element 104. The detection signal is a voltage signal loaded on two terminals of the inductance element 104 and is numerically equal to Ls×di/dt, so that the voltage signal may linearly reflect the variation of the value of di/dt.

In another embodiment, the inductance element 104 is a parasitic inductance in the power semiconductor switch 101, and the value of di/dt may be reflected by detecting the voltage signal loaded on the parasitic inductance 104, thereby determining whether a short circuit condition has been encountered by the power semiconductor switch series circuit.

In an embodiment, a short-circuit detection unit 103 is connected electrically between the second terminal and the third terminal of the power semiconductor switch 101, for detecting the value of the voltage between the second terminal and the third terminal of the power semiconductor switch 101, outputting a detection signal to the comparison module 106 according to the voltage value, and further determining whether a short circuit condition has been encountered by the power semiconductor switch series circuit. In an embodiment, the power semiconductor switches adopts IGBTs (Insulated Gate Bipolar Transistor) of the same model.

The comparison module 106 is electrically connected to the short-circuit detection unit 103 for receiving the detection signal outputted by the short-circuit detection unit 103 and comparing the detection signal with a predetermined threshold (such as a short-circuit protection threshold voltage). When the detection signal exceeds the predetermined threshold, the comparison module 106 outputs a short-circuit signal.

In an embodiment, the comparison module 106 may be a comparator. One terminal of the comparator receives the detection signal from the short-circuit detection unit 103, and the other terminal receives a predetermined threshold and compares the detection signal with a predetermined threshold, and the output terminal of the comparator outputs the short-circuit signal when the detection signal exceeds the predetermined threshold.

In some embodiments in which the comparison module 106 is a comparator, one terminal of the comparator receives a voltage signal from the short-circuit detection unit 103, which is reflecting variation of the di/dt value of the current flowing through the inductance element, and the other terminal receives a voltage threshold and compares the voltage signal with the voltage threshold, and the output terminal of the comparator outputs the short-circuit signal when the voltage signal exceeds the voltage threshold.

In some other embodiments in which the comparison module 106 is a comparator, one terminal of the comparator receives a voltage signal from the short-circuit detection unit 103, which is reflecting the value of the voltage between the second terminal and the third terminal of the power semiconductor switch, and the other terminal receives another voltage threshold and compares the voltage signal with the voltage threshold, and the output terminal of the comparator outputs the short-circuit signal when the voltage signal exceeds the voltage threshold.

In an embodiment, the comparison module 106 can be formed by two operational amplifiers and a logic gate circuit. The short-circuit detection unit 103 outputs two detection signals, i.e., a voltage signal reflecting the variation of the di/dt value of the current flowing through the inductance element and a voltage signal reflecting the value of the voltage between the second terminal and the third terminal of the power semiconductor switch.

Specifically, the voltage signal reflecting the variation of the di/dt value of the current flowing through the inductance element is coupled to a first terminal of a first operational amplifier. A first predetermined threshold is coupled to a second terminal of the first operational amplifier. The output terminal of the operational amplifier is coupled to a first input terminal of the logic gate circuit. The voltage signal reflecting the value of the voltage between the second terminal and the third terminal of the power semiconductor switch is coupled to a first terminal of a second operational amplifier. A second predetermined threshold is coupled to a second terminal of the second operational amplifier. The output terminal of the operational amplifier is coupled to a second input terminal of the logic gate circuit. The logic gate circuit outputs the short-circuit signal according to the comparison signal received by the first input terminal and the comparison signal received by the second input terminal. The logic gate circuit can be a logic OR gate circuit, or a logic AND gate circuit.

The equalizer circuit 105 is connected electrically between the second terminal and the third terminal of the power semiconductor switch 101, for performing static and dynamic voltage equalization on the power semiconductor switch 101.

The soft turn-off module 108 has an input terminal and an output terminal. The input terminal is connected electrically to the output terminal of the comparison module 106, for receiving the comparison signal generated when the detection signal from the short-circuit detection unit 103 is compared with the predetermined threshold (for example, when the detection signal exceeds the predetermined threshold, the comparison module 106 outputs a short-circuit signal). The output terminal is connected to the drive module 102 of the series module 10, for outputting the second control signal according to the received short-circuit signal when the short-circuit condition is encountered, so as to reduce the drive voltage outputted to the first terminal of the power semiconductor switch 101 by the drive module 102 and perform the soft turn-off operation. That is, when the short-circuit condition is encountered by the power semiconductor switch series circuit, the detection signal outputted by the short-circuit detection unit 103 exceeds the predetermined threshold. Thus the comparison module 106 outputs a short-circuit signal, and then the soft turn-off module 108 sends the second control signal corresponding to the short-circuit signal to the drive module 102, so as to limit the continuous rising of the short-circuit current flowing through the power semiconductor switch 101.

Referring to FIG. 1, the circuit architecture of the series module 20 is substantially the same or similar to that of the series module 10, and for simplicity of description, it is not further illustrated in detail.

The system control module 40 is electrically connected to the comparison modules 106 and 206, and the drive modules 102 and 202. The system control module 40 receives the short-circuit signals outputted by the comparison modules 106 and 206 and outputs first control signals corresponding to the short-circuit signals. Subsequently, the first control signals sent to the drive modules 102 and 202 are each amplified by the drive modules, and the amplified drive signals are transmitted to the first terminals of the power semiconductor switches 101 and 201 to drive the power semiconductor switches to be turned off In a specific embodiment, the system control module 40 may also perform a logic operation on the control signal for normally driving the power semiconductor switches 101 and 201 and the signal outputted by the comparison modules 106 and 206. For example, when the detection signal (i.e., the voltage signal loaded on two terminals of the inductance element) outputted by the short-circuit detection unit 103 or 203 exceeds the short-circuit protection threshold voltage, the short-circuit signal outputted by the comparison modules 106 or 206 may shield the normal drive signal, so that the system control module 40 outputs a first control signal corresponding to the short-circuit signal, thereby turning off the power semiconductor switch 101 and the power semiconductor switch 201 in the power semiconductor switch series circuit in a synchronized manner. When the detection signals outputted by the short-circuit detection units 103 and 203 are lower than the short-circuit protection threshold voltage, a short circuit condition is not encountered by the power semiconductor switch series circuit and meanwhile the comparison signal outputted by the comparison module 106 or 206 cannot shield the normal drive signal, so that the system control module 40 can still output the normal drive signal to keep the power semiconductor switch 101 and the power semiconductor switch 201 in the power semiconductor switch series circuit operating normally.

In a specific embodiment, when a short-circuit condition is encountered by the series module 10 of the power semiconductor switch series circuit, the second control signal outputted by the soft turn-off module 108 reaches the drive module 102 in advance of the first control signal outputted by the system control module 40. First the second control signal outputted by the soft turn-off module 108 controls the drive module 102, so as to drive the power semiconductor switch 101 to be turned off, and subsequently the first control signal outputted by the system control module 40 controls the drive modules 102 and 202, so as to drive the power semiconductor switches 101 and 201 to be turned off. Similarly, when the short-circuit condition is encountered by the series module 20 of the power semiconductor switch series circuit, the second control signal outputted by the soft turn-off module 208 reaches the drive module 202 in advance of the first control signal outputted by the system control module 40.

It can be known that, by adopting the soft turn-off module 108, while a short-circuit protection is performed on the power semiconductor switch series circuit, the second control signal outputted by the soft turn-off module can first limit the continuous rising of the short-circuit current flowing through the power semiconductor switch. Meanwhile, by adopting the short-circuit detection unit 103, the short-circuit fault in the power semiconductor switch series circuit can be detected quickly, and in combination of the soft turn-off function, the control voltage of the power semiconductor switch 101 is reduced, so as to quickly limit the continuous rising of the short-circuit current and protect the diode of the equalizer circuit 105. Subsequently, the system control module 40 outputs a first control signal to the drive modules 102 and 202, so as to drive the power semiconductor switches 101 and 201 to be turned off, thereby slowing the current decreasing rate of the power semiconductor switch, and effectively reducing the turn-off voltage peak caused by the parasitic inductance 104 in the power semiconductor switch series circuit, which enables the power semiconductor switch to have a larger safe working margin.

It would be understood by those skilled in the art that while the power semiconductor switch series circuit in FIG. 1 includes the series module 10 and the series module 20, the present disclosure is not limited to include two series modules. For example, in other embodiments, the power semiconductor switch series circuit of the present disclosure may also include three or more series modules, and such a configuration also falls within the spirit and scope of the present disclosure.

Figure 2:
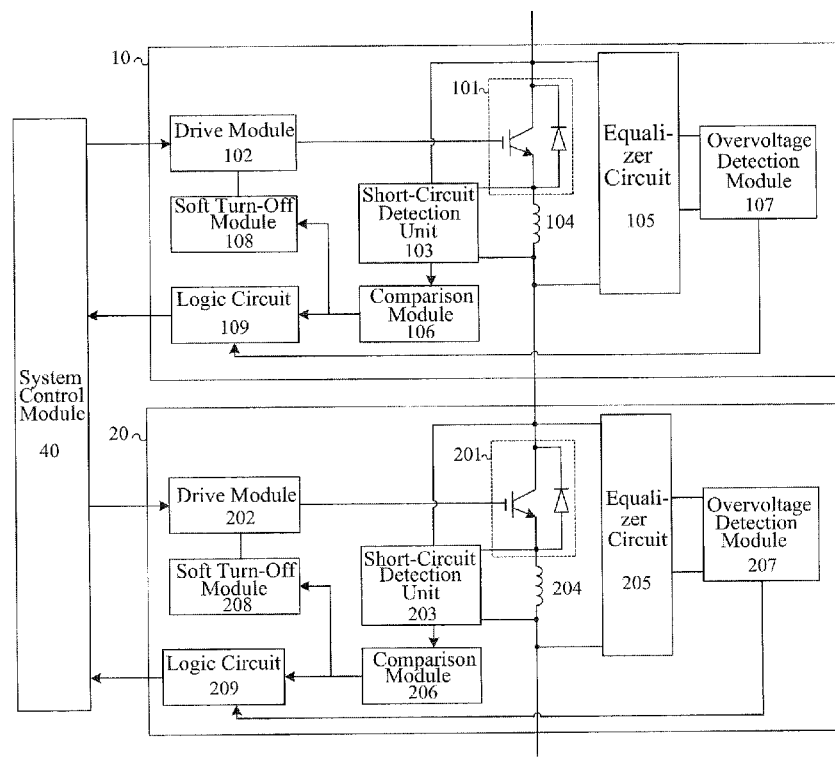
FIG. 2 is a schematic block diagram of a power semiconductor switch series circuit according to another aspect of the present disclosure.

FIG. 2 is a schematic block diagram of a power semiconductor switch series circuit according to an embodiment of the present disclosure.

Figures 3A, 3B:
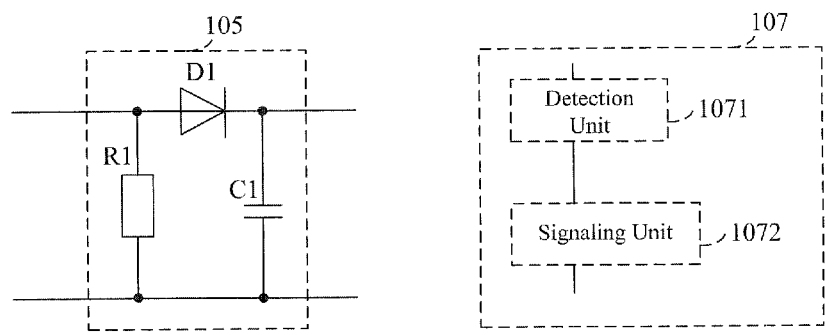
FIG. 3A is a schematic circuit diagram of an equalizer circuit 105 of a series module 10 in FIG. 1.
FIG. 3B is a schematic circuit diagram of an overvoltage detection module 107 of the series module 10 in FIG. 2.

FIG. 3A is a schematic circuit diagram of an equalizer circuit 105 of a series module 10 in FIG. 1, and FIG. 3B is a schematic circuit diagram of an overvoltage detection module 107 of the series module 10 in FIG. 2. Referring to FIGS. 2, 3A and 3B, when the power semiconductor switch series circuit of the present disclosure realizes the short-circuit detection and protection, the overvoltage detection and protection can be respectively performed with respect to the power semiconductor switch of each series module. For example, the power semiconductor switch series circuit may perform the overvoltage detection and protection with respect to the power semiconductor switches 101 and 201 on the series bridge arm by the overvoltage detection module 107 of the series module 10 and the overvoltage detection module 207 of the series module 20.

In a specific embodiment, taking the series module 10 as an example, in the power semiconductor switch series circuit of the present disclosure, the overvoltage detection module 107 may also be disposed in the series module 10, so that the overvoltage detection and protection may be performed with respect to all the power semiconductor switches on the series bridge arm by the overvoltage detection module 107. Similarly, by utilizing the overvoltage detection module 207 disposed in the series module 20, the overvoltage detection and protection may also be performed with respect to all the power semiconductor switches on the series bridge arm.

Referring to FIG. 3A, the equalizer circuit 105 of the series module 10 includes a resistor R1, a diode D1 and a capacitor C1. The resistor R1 is bridged across the second terminal and the third terminal of the power semiconductor switch 101. The diode D1 and the capacitor C1 are connected in series and then bridged across the second terminal and the third terminal of the power semiconductor switch 101. An anode of the diode D1 is connected to the second terminal of the power semiconductor switch 101, a cathode of the diode D1 is connected to one terminal of the capacitor C1, and the other terminal of the capacitor C1 is connected to the third terminal of the power semiconductor switch 101. The resistor R1 performs static voltage equalization on the power semiconductor switch 101, and the diode D1 and the capacitor C1 perform dynamic voltage equalization on the power semiconductor switch 101. It should be noted that the power semiconductor devices of the series circuit have inconsistent blocking characteristics, which cause a static voltage unequalization on the power semiconductor devices. The power semiconductor devices of the series circuit have inconsistent switching characteristics, which cause a dynamic voltage unequalization on the power semiconductor devices. Hence, resistors with identical resistance are connected in parallel between the second terminal and the third terminal of each power semiconductor switch on the series bridge arm, thereby realizing the static voltage equalization. In addition, due to the characteristic that the voltage loaded on two terminals of a capacitor cannot change instantly, the dynamic voltage equalization of the power semiconductor switch may be improved.

Referring to FIGS. 2 and 3B again, the overvoltage detection module 107 of the series module 10 includes a detection unit 1071 and a signaling unit 1072. The detection unit 1071 is connected between two terminals of the capacitor C1 in the equalizer circuit 105, so as to determine whether the voltage between the second terminal and the third terminal of the power semiconductor switch 101 is an overvoltage by detecting the value of the voltage at two terminals of the capacitor C1 using the detection unit 1071. The value of the voltage at two terminals of the capacitor C1 in the equalizer circuit 105 is configured for reflecting the voltage between the second terminal and the third terminal of the power semiconductor switch 101. The signaling unit 1072 outputs a voltage detection signal according to the voltage value detected by the detection unit 1071. The signaling unit 1072 is a non-isolation unit or an isolation unit.

For example, referring to FIG. 3B, the detection unit 1071 is configured for detecting the value of the voltage at two terminals of the capacitor C1 in the equalizer circuit 105, and the signaling unit 1072 is an isolation unit for outputting a voltage detection signal according to the detected voltage value. For example, the detection unit 1071 is a TVS diode or a voltage stabilizing diode, configured for reflecting whether the voltage between the second terminal and the third terminal of the power semiconductor switch 101 is an overvoltage. For example, the signaling unit 1072 is an isolation unit, which may be a high-speed optical coupler, so as to isolate the voltage value detected by the detection unit 1071 and the voltage detection signal outputted by the signaling unit 1072. Meanwhile, such a high-speed optical coupler can quickly transmit the voltage detection signal generated when an overvoltage condition is encountered to the logic circuit 109. For example, the high-speed optical coupler includes a light-emitting semiconductor and a light-receiving semiconductor, in which the light-emitting semiconductor and the detection unit 1071 are connected in series, and the light-receiving semiconductor is connected to the logic circuit 109.

In another embodiment, the logic circuit 109 of the power semiconductor switch series circuit has a plurality of input terminals and at least one output terminal. One input terminal is electrically connected to the output terminal of the overvoltage detection module 107 of the series module 10, another input terminal is electrically connected to the output terminal of the comparison module 106, and the output terminal of the logic circuit 109 outputs a third control signal according to the voltage detection signal from the overvoltage detection module 107 of the series module 10 and the comparison signal outputted by the comparison module 106. For example, the logic circuit 109 is an OR gate circuit, and when a short-circuit (for example, the short-circuit signal is at a high level) or an overvoltage (for example, the overvoltage signal is at a high level) condition is encountered by the power semiconductor switch series circuit, the third control signal outputted by the logic circuit 109 is a high level signal. In another example, the logic circuit is an AND gate circuit, and when a short-circuit (for example, the short-circuit signal is at a low level) or an overvoltage (for example, the overvoltage signal is at a low level) condition is encountered by the power semiconductor switch series circuit, the third control signal outputted by the logic circuit 109 is a low level signal.

The system control module 40 is electrically connected to the logic circuit 109 and the drive modules 102 and 202, for receiving the third control signal from the logic circuit 109 and outputting the first control signal corresponding to the third control signal. The first control signal is amplified by the drive modules 102 and 202 and then transmitted to the first terminals of the power semiconductor switches 101 and 201 of the series modules 10 and 20. Likewise, the system control module 40 may further perform the logic operation on the normal drive signal for the power semiconductor switches 101 and 201 and the third control signal outputted by the logic circuit 109. For example, when the third control signal indicates that a short-circuit or an overvoltage condition is encountered by the power semiconductor switch series circuit, the third control signal outputted by the logic circuit 109 can shield the normal drive signal, so that the system control module 40 outputs the first control signal corresponding to the short-circuit signal or the overvoltage signal, and the first control signal is amplified by the drive modules 102 and 202 and then transmitted to the first terminals of the power semiconductor switches 101 and 201 of series modules 10 and 20, thereby turning off the power semiconductor switches 101 and 201 in a synchronized manner. When the third control signal indicates that neither a short-circuit nor an overvoltage condition is encountered by the power semiconductor switch series circuit, the third control signal outputted by the logic circuit 109 cannot shield the normal drive signal, so the system control module 40 still outputs the signal to keep the power semiconductor switches 101 and 201 operating normally. In a specific embodiment, the third control signal from the logic circuit 109 is transmitted to the system control module 40 through an optical fiber.

Figure 4A:
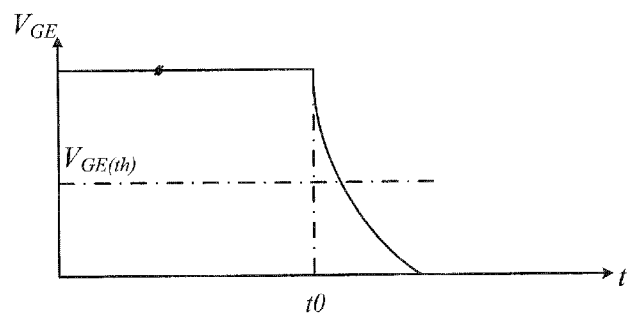
FIGS. 4A and 4B illustrate respectively a waveform of a control voltage and a waveform of a short-circuit current passing through the power semiconductor switch when the power semiconductor switch of the series module in FIG. 1 is turned off.
Figure 4B:
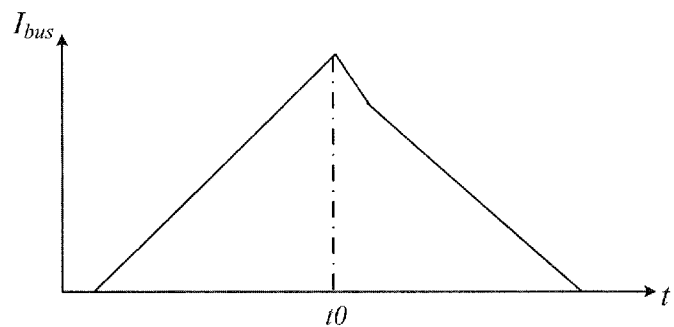
Figure 5A:
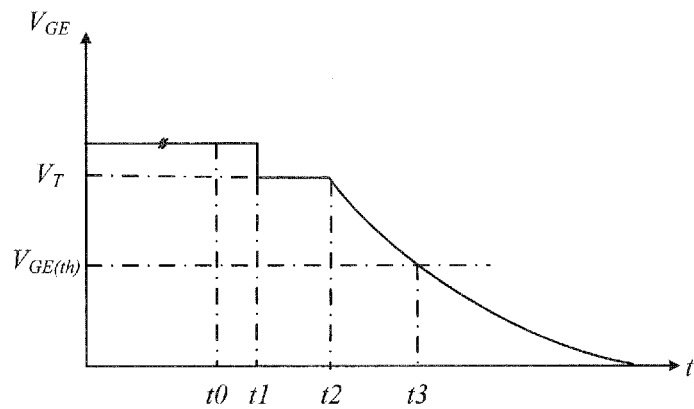
FIGS. 5A and 5B illustrate respectively a waveform of a control voltage and a waveform of a short-circuit current passing through the power semiconductor switch when a soft turn-off operation is performed on the power semiconductor switch of the series module in FIG. 2.
Figure 5B:
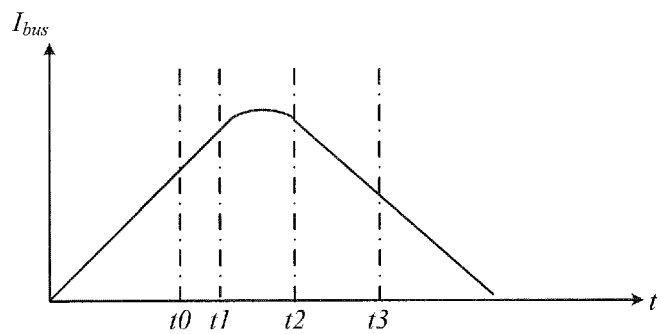

FIGS. 4A and 4B illustrate respectively a waveform of a control voltage and a waveform of a short-circuit current passing through the power semiconductor switch when the power semiconductor switch of the series module in FIG. 1 is turned off. FIGS. 5A and 5B illustrate respectively a waveform of a control voltage and a waveform of a short-circuit current passing through the power semiconductor switch when a soft turn-off operation is performed on the power semiconductor switch of the series module in FIG. 1.

Referring to FIGS. 4A and 4B, the present control voltage of the power semiconductor switch is assumed to be $V_{GE}$ and the threshold voltage when the power semiconductor switch is turned on is assumed to be $V_{GE(th)}$. At time t0, the current $L_{bus}$ of the circuit reaches a peak value and the control voltage is gradually reduced from $V_{GE}$. Subsequently, the general turning off process of the power semiconductor switch is performed.

In contrast to FIGS. 4A and 4B, FIGS. 5A and 5B respectively are a waveform of the control voltage and a waveform of the short-circuit current passing through the power semiconductor switch when the soft turn-off operation is introduced. It is evident from FIGS. 5A and 5B that when a short circuit condition is encountered by the power semiconductor switch series circuit at time t0, the soft turn-off circuit starts to output the second control signal corresponding to the short-circuit signal to the drive module, so as to drive the power semiconductor switch to be turned off. Due to the time delay of the signal transmission, the control voltage is reduced from $V_{GE}$ to $V_T$ at time t1, and during the period from time t0 to time t1, the short-circuit current passing through the power semiconductor switch keeps rising. Subsequently, during the period from time t1 to time t2, the control voltage of the power semiconductor switch does not change and remains $V_T$, and since the saturation current value is reduced by the control voltage $V_T$ of the power semiconductor switch, the short-circuit current passing through the power semiconductor switch does not continue to rise and is instead maintained at the saturation current value corresponding to the control voltage $V_T$. Thereafter, from time t2, the control voltage is reduced slowly, so as to perform a soft turning off of the power semiconductor switch.

It is evident from a comparison of FIGS. 4B and 5B that with the application of the soft turn-off procedure, when a short circuit condition is encountered by the power semiconductor switch series circuit, after the current limiting section of t1-t2 and the soft turn-off section of t2-t3, the waveform of the short-circuit current passing through the power semiconductor switch is not rising, which can effectively suppress the spike current during turning off. Moreover, in the soft turn-off period, the current passing through the power semiconductor switch is reduced slowly, thereby effectively reducing a turn-off voltage spike incurred by the parasitic inductance in the power semiconductor switch series circuit. Hence, the power semiconductor switch has a larger safe operating margin.

Figure 6:
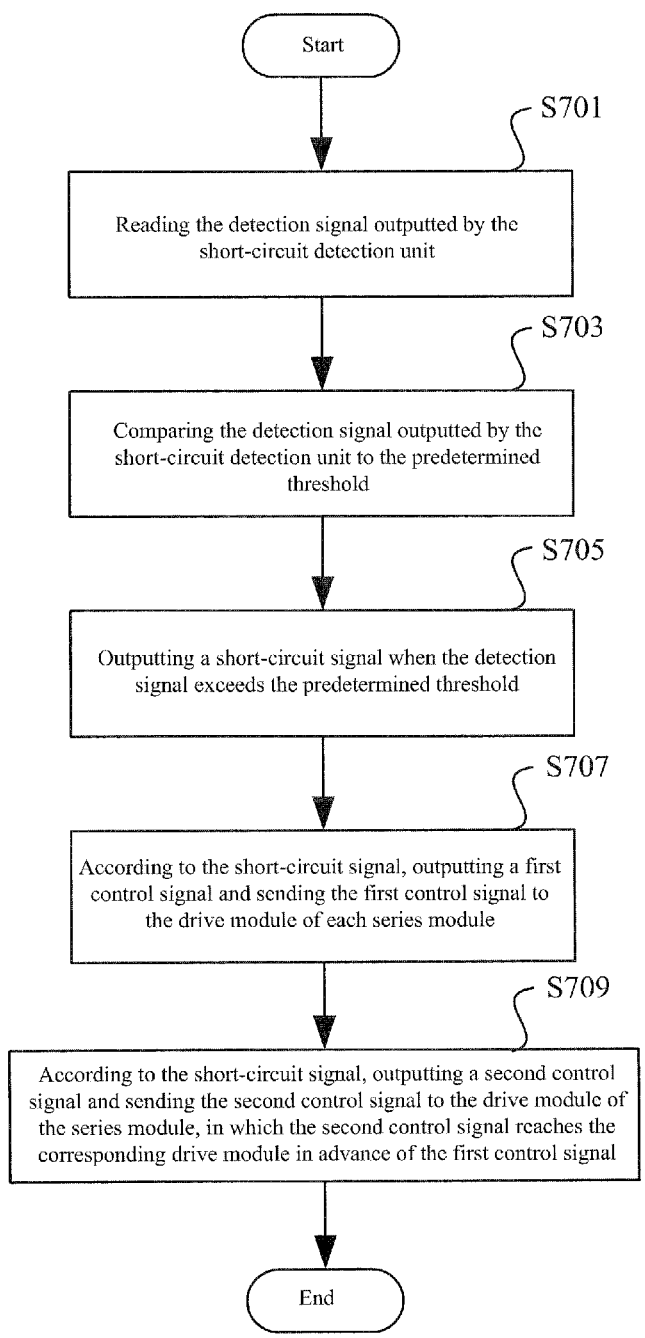
FIG. 6 is a flow chart of a control method of the power semiconductor switch series circuit according to another specific embodiment of the present disclosure.

FIG. 6 is a flow chart of a control method of the power semiconductor switch series circuit according to an aspect of the present disclosure. According to this method, in step S701, the detection signal outputted by the short-circuit detection unit is read. For example, the short-circuit detection unit is connected electrically between two terminals of the inductance element, and the voltage signal at two terminals of the inductance element is read, i.e., $L_s \times di/dt$, so as to quickly reflect the variation of the value of di/dt, thereby detecting whether a short circuit condition is encountered by the power semiconductor switch series circuit. The short-circuit detection unit can further detect the value of the voltage between the second terminal and the third terminal of the power semiconductor switch, thereby determining whether a short circuit condition is encountered by the power semiconductor switch series circuit. Subsequently, in steps S703 and S705, the detection signal outputted by the short-circuit detection unit and the predetermined threshold are compared. When the detection signal exceeds the predetermined threshold, this indicates that a short circuit condition is encountered by the power semiconductor switch series circuit, and a short-circuit signal is outputted. When the detection signal is lower than the predetermined threshold, this indicates that a short circuit condition is not encountered by the power semiconductor switch series circuit. Next, in step S707, according to the short-circuit signal, a first control signal corresponding to the short-circuit signal is outputted, and the first control signal is amplified and then transmitted to the drive module of each series module, so as to drive the power semiconductor switch to be turned off. For example, the first control signal is transmitted to the drive module through an optical fiber, and after being amplified, the control signal is transmitted to the power semiconductor switch of each series module. Finally, in step S709, according to the short-circuit signal, a second control signal corresponding to the short-circuit signal is outputted, and the second control signal is transmitted to the drive module of the series module, so as to drive the power semiconductor switch to be turned off. The second control signal reaches the corresponding drive module in advance of the first control signal.

Figure 7:
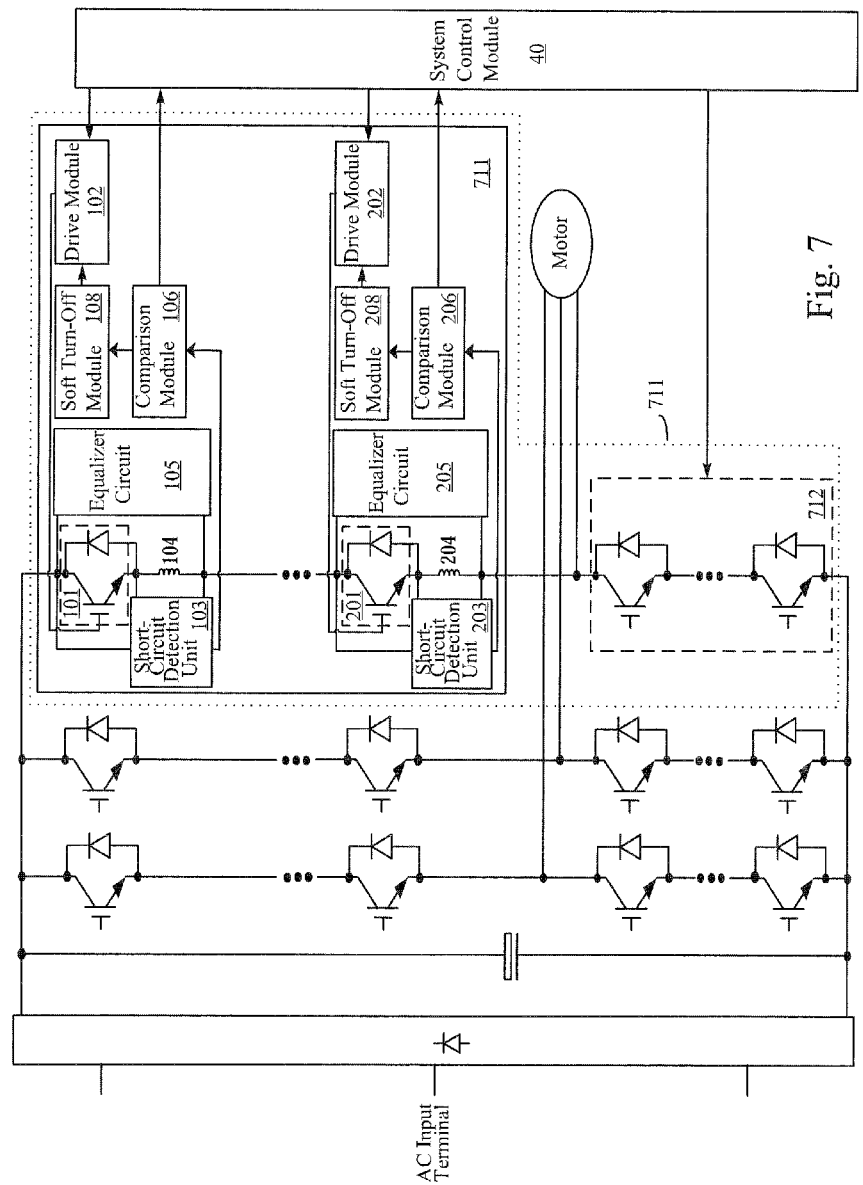
FIG. 7 is a schematic diagram of an application of the power semiconductor switch series circuit of the present disclosure in a power conversion apparatus.

FIG. 7 is a schematic diagram of an application of the power semiconductor switch series circuit of the present disclosure in a power conversion apparatus. The power conversion apparatus includes a three-phase converter. The bridge arm in each phase of the three-phase converter has at least two sub-bridge arms. The sub-bridge arm is formed by the above mentioned power semiconductor switch series circuit. For example, the power semiconductor switch series circuit is formed by the series modules 10 and 20. The three-phase converter may be a two-level converter, a three-level converter or a multilevel converter. Referring to FIG. 7, the three-level converter has three bridge arms, each of which is divided into an upper bridge arm and a lower bridge arm. For example, the first bridge arm 71 includes an upper bridge arm 711 and a lower bridge arm 712. The upper bridge arm 711 includes the aforementioned power semiconductor switch series circuit of the present disclosure, so as to be equivalent to a single high-voltage semiconductor device, and the lower bridge arm 712 also includes the aforementioned power semiconductor switch series circuit of the present disclosure, so as to be equivalent to another single high-voltage semiconductor device. When the three-level converter and the three-phase motor are electrically connected, each output terminal of the three bridge arms of the three-level converter is electrically connected to the corresponding phase of the motor.

In an embodiment, in the first bridge arm 71, when the upper bridge arm 711 stays in a working state and the lower bridge arm 712 stays in an idle state, a detection signal is outputted by the short-circuit detection unit of the power semiconductor switch series circuit of the present disclosure, thereby quickly detecting if a short circuit condition is encountered by the first bridge arm 71. For example, when a short circuit condition is encountered by the upper bridge arm 711, the system control module 40 sends a control signal to respective power semiconductor switches of the upper bridge arm 711 and the lower bridge arm 712 in the first bridge arm 71, so as to turn off the entire first bridge arm 71. Likewise, in the first bridge arm 71, when the lower bridge arm 712 stays in the working state and the upper bridge arm 711 stays in the idle state, a detection signal is outputted by the short-circuit detection unit of the power semiconductor switch series circuit of the present disclosure, thereby quickly detecting if a short circuit condition is encountered by the first bridge arm 71. For example, when a short circuit condition is encountered by the lower bridge arm 712, the system control module 40 sends a control signal to respective power semiconductor switches of the upper bridge arm 711 and the lower bridge arm 712 in the first bridge arm 71, so as to turn off the entire first bridge arm 71.

It would be understood by those skilled in the art that for the same bridge arm, the upper bridge arm 711 or the lower bridge arm 712 may also include two or more power semiconductor switch series circuits which are connected in series. In other words, the upper bridge arm 711 or the lower bridge arm 712 may at least include an equivalent high-voltage semiconductor device and another equivalent high-voltage semiconductor device which are connected in series, and the two equivalent high-voltage semiconductor devices are respectively realized by the aforementioned power semiconductor switch series circuit of the present disclosure.

In the application of the power semiconductor switch series circuit of the present disclosure, by the short-circuit detection unit, the short-circuit parameters (such as the di/dt value and/or the value of the voltage between the second terminal and the third terminal of the power semiconductor switch) of the power semiconductor switch circuit are detected and a detection signal is outputted. When the detection signal exceeds the predetermined threshold, the short-circuit detection unit further outputs the short-circuit signal, and thus first the soft turn-off module outputs a second control signal corresponding to the short-circuit signal to the drive module, so as to drive the power semiconductor switch to be turned off. Subsequently, the system control module outputs a first control signal corresponding to the short-circuit signal to the drive module of each series module, so as to drive the power semiconductor switch on the entire bridge arm to be turned off the voltage loaded on the two terminals of the short-circuit detection unit of at least one series module is measured, so as to avoid damage to the power semiconductor switches due to a short-circuit fault, thereby improving the operation reliability of the power semiconductor switch series circuit. Furthermore, when the short-circuit protection is performed with respect to the power semiconductor switches, the overvoltage protection may also be performed with respect to the power semiconductor switch of each series module, so that the power semiconductor switch series circuit has a short-circuit protection function as well as an overvoltage protection function. When the short-circuit detection unit detects that a short-circuit condition is encountered in the circuit, first the soft turn-off technology is adopted to reduce the control voltage of the power semiconductor switch so as to limit the continuous rising of the short-circuit current and to protect the diode of the equalizer circuit. Subsequently, the system control module outputs a first control signal to the drive module, so as to drive the power semiconductor switch to be turned off, slow the current decreasing rate of the power semiconductor switch and avoid the generation of overshoot voltage, thereby enabling the power semiconductor switch to have a larger safe working margin. Additionally, when the short-circuit protection is performed on the power semiconductor switch, meanwhile an overvoltage protection is performed on the power semiconductor switch of each series module simultaneously, so as to enable the power semiconductor switch series circuit to have the short-circuit protection function as well as the overvoltage protection function.

Although the present disclosure has been disclosed with reference to the above embodiments, the embodiments are not intended to limit the present disclosure. It will be apparent to those skilled in the art that various modifications and variations can be made without departing from the scope and spirit of the present disclosure. Therefore, the scope of the present disclosure shall be defined by the appended claims.

What is claimed is:

1. A power semiconductor switch series circuit, comprising:
 a plurality of series modules, each of the series modules comprising:
  a power semiconductor switch having a first terminal, a second terminal and a third terminal, wherein the first terminal receives a drive signal, the second terminal is coupled to a third terminal of a power semiconductor switch of an adjacent series module, and the third terminal is coupled to a second terminal of an power semiconductor switch of another adjacent series module;
  a drive module connected electrically to the first terminal of the power semiconductor switch, for outputting the drive signal, so as to drive the power semiconductor switch to be turned on or turned off by the drive signal;
  a short-circuit detection unit connected electrically to the power semiconductor switch, for outputting at least one detection signal;
  an equalizer circuit connected electrically between the second terminal and the third terminal of the power semiconductor switch, for performing static and dynamic voltage equalization on the power semiconductor switch;
  a comparison module connected electrically to the short-circuit detection unit, for receiving the detection signal and comparing the detection signal with a predetermined threshold, and outputting a short-circuit signal when the detection signal exceeds the predetermined threshold; and a soft turn-off module, wherein when receiving the short-circuit signal from the comparison module, the soft turn-off module outputs a second control signal corresponding to the short-circuit signal to the drive module; and a system control module electrically connected to the comparison module and the drive module of each series module, wherein when receiving the short-circuit signal from the comparison module, the system control module outputs a first control signal corresponding to the short-circuit signal to the drive module so as to turn off the power semiconductor switch of each series module.

2. The power semiconductor switch series circuit of claim 1, wherein the series module comprises an inductance element, so as to output the detection signal by detecting the di/dt value of the current flowing through the inductance element.

3. The power semiconductor switch series circuit of claim 2, wherein the inductance element is connected in series between the power semiconductor switches of two adjacent series modules.

4. The power semiconductor switch series circuit of claim 2, wherein the inductance element is a parasitic inductance in the power semiconductor switch of the series module.

5. The power semiconductor switch series circuit of claim 1, wherein the short-circuit detection unit is connected electrically between the second terminal and the third terminal of the power semiconductor switch, for detecting the value of the voltage between the second terminal and the third terminal of the power semiconductor switch and outputting the detection signal according to the voltage value.

6. The power semiconductor switch series circuit of claim 1, wherein the equalizer circuit has a resistor, a diode and a capacitor, the resistor is bridged across the second terminal and the third terminal of the power semiconductor switch, and the diode and the capacitor are connected in series and then bridged across the second terminal and the third terminal of the power semiconductor switch, wherein an anode of the diode is connected to the second terminal of the power semiconductor switch and a cathode of the diode is connected to the capacitor.

7. The power semiconductor switch series circuit of claim 6, wherein the series module further comprises an overvoltage detection module, the overvoltage detection module comprising:

a detection unit for detecting a voltage signal reflecting the voltage between the second terminal and the third terminal of the power semiconductor switch, so as to determine whether the voltage between the second terminal and the third terminal of the power semiconductor switch is an overvoltage by the voltage signal; and a signaling unit, wherein when the voltage between the second terminal and the third terminal of the power semiconductor switch is the overvoltage, the signaling unit outputs an overvoltage signal.

8. The power semiconductor switch series circuit of claim 7, wherein the overvoltage detection module is connected between two terminals of the capacitor in the equalizer circuit, and the detection unit detects the voltage signal at two terminals of the capacitor.

9. The power semiconductor switch series circuit of claim 7, further comprising a logic circuit having a plurality of input terminals and at least one output terminal, wherein the plurality of input terminals are respectively connected to the output terminal of the comparison module and the output terminal of the overvoltage detection module, and the output terminal of the logic circuit is configured for outputting a third control signal.

10. The power semiconductor switch series circuit of claim 9, wherein the system control module is electrically connected to the output terminal of the logic circuit for receiving the third control signal and outputting the first control signal corresponding to the third control signal to the drive module of each series module.

11. The power semiconductor switch series circuit of claim 1, wherein the comparison module is a comparator for comparing the detection signal and the predetermined threshold and for outputting the short-circuit signal when the detection signal exceeds the predetermined threshold.

12. The power semiconductor switch series circuit of claim 1, wherein when a short circuit condition is encountered by the power semiconductor switch series circuit, the second control signal reaches the drive module in advance of the first control signal.

13. The power semiconductor switch series circuit of claim 1, wherein the power semiconductor switch is an insulated gate bipolar transistor (IGBT).

14. A control method of the power semiconductor switch series circuit of claim 1, comprising:

reading the detection signal outputted by the short-circuit detection unit;

comparing the detection signal with the predetermined threshold;

outputting a short-circuit signal when the detection signal exceeds the predetermined threshold;

outputting a first control signal corresponding to the short-circuit signal according to the short-circuit signal and sending the first control signal to the drive module of each series module, so as to drive the power semiconductor switch of each series module to be turned off; and outputting a second control signal corresponding to the short-circuit signal according to the short-circuit signal and sending the second control signal to the drive module of the corresponding series module, so as to drive the power semiconductor switch of the series module to be turned off;

wherein the second control signal reaches the drive module in advance of the first control signal.

15. The method of claim 14, wherein the power semiconductor switch is an insulated gate bipolar transistor (IGBT).

16. A power conversion apparatus comprising a three-phase converter, wherein a bridge arm of each phase of the three-phase converter has at least two sub-bridge arms, wherein each of the sub-bridge arms is formed by one or more power semiconductor switch series circuits of claim 1.

17. The power conversion apparatus of claim 16, wherein the three-phase converter is a 2-level converter, a 3-level converter or a multilevel converter.

* * * * *